(12) United States Patent
Graff

(10) Patent No.: US 8,569,179 B2
(45) Date of Patent: *Oct. 29, 2013

(54) METHOD FOR ETCHING ORGANIC HARDMASKS

(75) Inventor: Wesley P. Graff, Singapore Science Park I (SG)

(73) Assignee: Novellus Systems, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/371,184

(22) Filed: Feb. 10, 2012

(65) Prior Publication Data

US 2012/0149207 A1   Jun. 14, 2012

Related U.S. Application Data

(63) Continuation of application No. 12/142,226, filed on Jun. 19, 2008, now Pat. No. 8,114,782, which is a continuation of application No. 11/263,148, filed on Oct. 31, 2005, now Pat. No. 7,399,712.

(51) Int. Cl.
*H01L 21/302* (2006.01)

(52) U.S. Cl.
USPC ........... 438/725; 438/706; 438/710; 438/714; 438/720; 216/58; 216/67

(58) Field of Classification Search
USPC ................ 438/706, 710, 719, 720, 714, 725; 216/58, 67

See application file for complete search history.

(56) References Cited

U.S. PATENT DOCUMENTS

| | | | |
|---|---|---|---|
| 5,900,288 A | 5/1999 | Kuhman et al. | |
| 6,387,819 B1 | 5/2002 | Yu | |
| 6,458,516 B1 | 10/2002 | Ye | |
| 6,541,397 B1 | 4/2003 | Bencher | |
| 6,613,434 B1 | 9/2003 | Drevillon et al. | |
| 6,635,185 B2 | 10/2003 | Demmin et al. | |
| 6,787,452 B2 | 9/2004 | Sudijono et al. | |
| 6,787,819 B2 | 9/2004 | Rhodes et al. | |
| 7,064,078 B2 | 6/2006 | Liu et al. | |
| 7,202,176 B1 | 4/2007 | Goto et al. | |
| 7,205,228 B2 | 4/2007 | Padhi et al. | |
| 7,235,478 B2 | 6/2007 | Geng et al. | |
| 7,288,484 B1 | 10/2007 | Goto et al. | |
| 7,399,712 B1 | 7/2008 | Graff | |
| 7,576,009 B2 | 8/2009 | Lee et al. | |
| 7,981,810 B1 | 7/2011 | Subramonium et al. | |

(Continued)

OTHER PUBLICATIONS

U.S. Appl. No. 11/263,148, Office Action mailed Jun. 1, 2007.

(Continued)

*Primary Examiner* — Shamim Ahmed
(74) *Attorney, Agent, or Firm* — Weaver Austin Villeneuve & Sampson LLP

(57) ABSTRACT

A method of etching or removing an amorphous carbon organic hardmask overlying a low dielectric constant film in a lithographic process. The method includes providing a dielectric film having thereover an amorphous carbon organic hardmask to be removed, the dielectric film having a dielectric constant no greater than about 4.0, introducing over the amorphous carbon organic hardmask an ionizable gas comprising a mixture of hydrogen and an oxidizing gas, and applying energy to the mixture to create a plasma of the mixture. The method further includes contacting the amorphous carbon organic hardmask with the plasma, with the amorphous carbon organic hardmask being at a temperature in excess of 200° C., to remove the amorphous carbon organic hardmask without substantially harming the underlying substrate.

8 Claims, 3 Drawing Sheets

(56) References Cited

U.S. PATENT DOCUMENTS

| | | |
|---|---|---|
| 8,114,782 B2 | 2/2012 | Graff |
| 8,129,281 B1 | 3/2012 | Cheung et al. |
| 2005/0129935 A1 | 6/2005 | Kunitake et al. |
| 2005/0167394 A1 | 8/2005 | Iiu et al. |
| 2005/0202683 A1 | 9/2005 | Wang et al. |
| 2006/0154477 A1 | 7/2006 | Geng et al. |
| 2006/0231524 A1 | 10/2006 | Liu et al. |
| 2007/0077780 A1 | 4/2007 | Wang et al. |
| 2008/0254639 A1 | 10/2008 | Graff |

OTHER PUBLICATIONS

U.S. Appl. No. 11/263,148, Office Action mailed Oct. 24, 2007.

U.S. Appl. No. 11/263,148, Notice of Allowance mailed Mar. 18, 2008.

U.S. Appl. No. 12/142,226, Office Action mailed May 2, 2011.

U.S. Appl. No. 12/142,226, Notice of Allowance mailed Oct. 13, 2011.

U.S. Appl. No. 13/372,363, "Method for etching organic hardmasks," Wesley P. Graff, filed Feb. 13, 2012.

METHOD FOR ETCHING ORGANIC HARDMASKS

CROSS-REFERENCE TO RELATED APPLICATIONS

This application is a continuation of prior application Ser. No. 12/142,226 filed on Jun. 19, 2008, now issued as U.S. Pat. No. 8,114,782, which is a continuation of prior application Ser. No. 11/263,148 filed on Oct. 31, 2005, now issued as U.S. Pat. No. 7,399,712, the disclosures of which are incorporated by reference herein in their entireties.

BACKGROUND OF THE INVENTION

1. Field of the Invention

The present invention relates to a cleaning process used in a semiconductor lithographic manufacturing system and, in particular, to a method for etching or removing an organic hardmask such as amorphous carbon from a low dielectric constant film.

2. Description of Related Art

Integrated circuits (ICs) are fabricated on semiconductor wafer substrates by a lithographic process. The lithographic process allows for a mask pattern of the desired circuit or portion thereof to be transferred via radiant energy of selected wavelengths to a photoresist film on a substrate. Those segments of the absorbed aerial image, whose energy exceeds a threshold energy of chemical bonds in the photoactive component of the photoresist material, create a latent image in the resist. The latent image marks the volume of resist material that either is removed during the development process (in the case of positive photoresist) or remains after development (in the case of negative photoresist) to create a three-dimensional pattern in the resist film. In subsequent processing, the resulting resist film pattern is used as an etch mask to remove underlying substrates from the areas of the patterned openings in the resist layer.

Damascene processing techniques are often used in integrated circuit manufacturing, and involve forming inlaid metal conductors in trenches and vias in a dielectric layer. Openings in a hardmask layer are used to etch the desired portions of the dielectric layer to form the trenches and vias. The hardmask layer openings are themselves formed by etching through openings formed in an overlying resist layer. Hardmasks in damascene process are often made from amorphous carbon, also known as a-carbon or alpha-carbon.

The move from 248 nm to 193 nm wavelength lithography has increased the complexity of the masking integration, often requiring a multilayer stack to be deposited on top of the layer to be etched. An example of this is a three layer stack of an amorphous carbon hardmask layer covered by a SiON anti-reflective coating (ARC) layer on which conventional resist can be spun and processed. After the resist is developed, a fluorine dry etch transfers the pattern to the SiON layer. The resist is stripped in conjunction with an oxygen based etch process to remove a-carbon in the hardmask layer from the openings in the SiON layer. A dielectric etch process then transfers the pattern from the a-carbon hardmask into an underlying dielectric layer used in a dual damascene approach. Following the etching of the dielectric layer, the a-carbon hardmask layer must be removed prior to forming Cu or other metal interconnects in the backend of the wafer process flow.

Sudijono et al. U.S. Pat. No. 6,787,452 discloses a method of controlling a critical dimension during a photoresist patterning process which can be applied to forming vias and trenches in a dual damascene structure. An amorphous carbon ARC is deposited on a substrate by a plasma enhanced chemical vapor deposition (PECVD) method. The alpha-carbon layer provides a high etch selectivity relative to oxide and is disclosed as being readily removed by a plasma ashing step using oxygen. Ye et al U.S. Pat. No. 6,458,516 teaches a method of removing a polymeric, organic masking layer using a hydrogen/nitrogen-based plasma.

Low dielectric constant (low-k) materials, i.e., those having a dielectric constant generally below about 2.7 to 3.0, have been used in damascene processes as inter-metal and/or inter-layer dielectrics between conductive interconnects employed to reduce the delay in signal propagation due to capacitive effects. The lower the dielectric constant of the dielectric material, the lower the capacitance of the dielectric and the lower the RC delay of the integrated circuit. Typically, low-k dielectrics are silicon-oxide based materials with some amount of incorporated carbon, commonly referred to as carbon doped oxide (CDO). An example of a CDO is CORAL brand carbon-doped oxides, from Novellus Systems, Inc. of San Jose, Calif. It has been found that highly oxidizing conditions are generally unsuitable for use on low-k materials. When exposed to an $O_2$ plasma, the oxygen scavenges or removes carbon from the low-k materials. In many of these materials such as CDOs, the presence of carbon is instrumental in providing a low dielectric constant. Hence, to the extent that the oxygen removes carbon from these materials, it effectively increases the dielectric constant. As processes used to fabricate integrated circuits move toward smaller and smaller dimensions and requires the use of dielectric materials having lower and lower dielectric constants, it has been found that the conventional strip plasma conditions are not suitable.

Consequently, a need exists in the art for the development of an alternative process that effectively removes organic hardmask layers such as amorphous carbon, and that does not remove excessive amounts of the low-k dielectric materials or otherwise materially alter the properties of low-k dielectric materials.

SUMMARY OF THE INVENTION

Bearing in mind the problems and deficiencies of the prior art, it is therefore an object of the present invention to provide an improved method of etching and removing an amorphous carbon organic hardmask from wafer substrates in a lithographic process.

It is another object of the present invention to provide a method of removing an amorphous carbon organic hardmask without damaging an underlying dielectric layer.

A further object of the invention is to provide a method of removing an organic hardmask layer without damaging an underlying low-k dielectric layer.

It is yet another object of the present invention to provide a method of removing an organic hardmask layer without affecting critical dimension features etched into an underlying low-k dielectric layer.

Still other objects and advantages of the invention will in part be obvious and will in part be apparent from the specification.

The above and other objects, which will be apparent to those skilled in art, are achieved in the present invention which is directed to a method of etching or removing an amorphous carbon organic hardmask comprising providing a substrate having thereover an amorphous carbon organic hardmask to be removed, introducing over the substrate and amorphous carbon organic hardmask an ionizable gas comprising a mixture of hydrogen and an oxidizing gas, and applying energy to the mixture to create a plasma of the mixture. The method then includes contacting the amorphous carbon organic hardmask with the plasma, wherein the substrate and amorphous carbon organic hardmask are at a temperature in excess of 200° C., to remove at least a portion of the amorphous carbon organic hardmask and exposing the substrate without substantially harming the underlying substrate.

Preferably, the amorphous carbon organic hardmask is completely removed from the underlying substrate.

In another aspect, the present invention is directed to a method of removing an amorphous carbon organic hardmask overlying a low dielectric constant film in a lithographic process comprising providing a dielectric film having thereover an organic hardmask to be removed, the dielectric film having, a dielectric constant no greater than about 4.0, and contacting the organic hardmask with plasma comprising an ionized mixture of hydrogen and an oxidizing gas, wherein the dielectric film and organic hardmask are at a temperature in excess of 200° C., to remove the organic hardmask without substantially affecting the underlying dielectric film.

In a further aspect, the present invention is directed to a method of etching or removing an amorphous carbon organic hardmask overlying a low dielectric constant film in a lithographic process comprising providing a dielectric film having thereover an amorphous carbon organic hardmask to be removed, the dielectric film having a dielectric constant no greater than about 4.0, introducing over the amorphous carbon organic hardmask an ionizable gas comprising a mixture of hydrogen and an oxidizing gas, and applying energy to the mixture to create a plasma of the mixture.

The method further includes contacting the amorphous carbon organic hardmask with the plasma, wherein the dielectric film and amorphous carbon organic hardmask are at a temperature in excess of 200° C., to remove the amorphous carbon organic hardmask without substantially harming the underlying substrate.

The organic hardmask may be chemical vapor deposited amorphous carbon and the substrate may be a dielectric film, such as a dielectric film having a dielectric value less than about 3.0, for example, a carbon-doped oxide dielectric film.

The organic hardmask may be amorphous carbon, and the dielectric film may have a dielectric constant no greater than about 2.8.

The oxidizing gas may be provided from a source of carbon dioxide. The gas mixture is preferably essentially nitrogen-free.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

Figure 1:
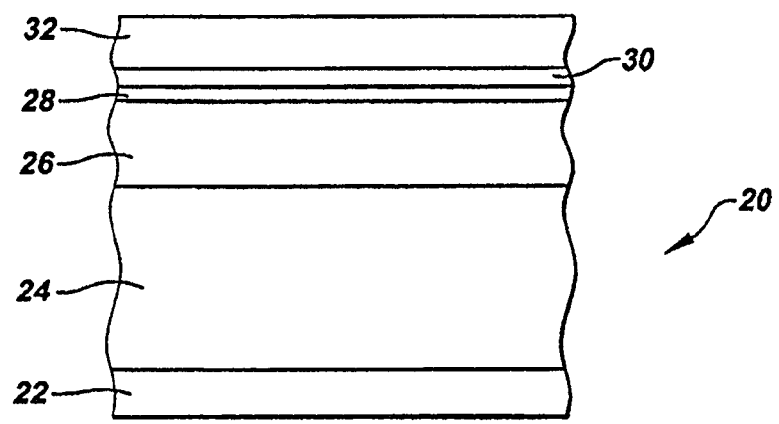
FIG. 1 is a cross-sectional elevational view of an organic hardmask, photoresist and other layers deposited on a wafer substrate over a low-k dielectric layer to be etched.

DESCRIPTION OF THE PREFERRED
EMBODIMENT(S)

In describing the preferred embodiment of the present invention, reference will be made herein to FIGS. 1-5 of the drawings in which like numerals refer to like features of the invention.

The present invention is directed to the removal of organic hardmask materials used to form ashable hardmasks (AHM), particularly amorphous carbon hardmasks, known as a-carbon or alpha-carbon. This type of organic hardmask is an organic masking material that is typically chemical vapor deposited (CVD), and primarily consists of carbon, for example, 50-80 weight percent, with the remainder consisting of hydrogen and possibly trace nitrogen. Examples of starting materials used to form such films include $CH_4$ and $C_2H_2$.

While the method of the present invention may be used to efficiently and effectively to remove organic hardmask materials from low-k dielectric films, it is not limited to low-k dielectric films, or even to dielectrics. The invention is also not limited to any particular category of low-k dielectrics. For instance, the present invention may be effectively used with dielectrics with k values less than 4.0 (also known as first generation low-k dielectrics), dielectrics with k values less than about 2.8 (second generation low-k dielectrics) and dielectrics with k values less than about 2.0 (ultra-low-k dielectrics). The low-k dielectric may be porous or non-porous (the latter sometimes referred to as a dense low-k dielectric). Generally, dense low-k dielectrics are those having k values no greater than 2.8 and low-k porous dielectrics are those having k values no greater than 2.2. Low-k dielectrics of any suitable composition may be used, including silicon oxide based dielectrics doped with fluorine and/or carbon. Non-silicon oxide based dielectrics, such as polymeric materials, may also be used. Any suitable process may be used to deposit the low-k dielectric, including as spin-on deposit and CVD deposit techniques. In the case of forming porous dielectrics, any suitable method may be used. A typical method involves co-depositing a silicon-based backbone and an organic porogen and subsequently removing the porogen component, leaving a porous dielectric film. Other methods include sol-gel techniques. Specific examples of suitable low-k films are carbon based spin-on type films sold under the trademark SiLK by Dow Chemicals, Inc. and CVD deposited porous films sold under the trademark CORAL by Novellus Systems, Inc.

The organic hardmask is preferably etched and removed by reactive plasma etching. In general, reactive plasma etching is performed in situ in a plasma reactor in which the processing chamber promotes excitation and/or disassociation of the reactant gases by the application of RF energy with capacitively coupled electrodes disposed in the processing chamber. The plasma typically creates a highly reactive species that reacts with and etches away the unwanted deposition material present in the processing chamber. The present invention may use plasmas generated with microwave (MW), inductively coupled plasma (ICP) or in a parallel plate reactive ion etch (RIE) reactor.

The plasma reactor apparatus that may be used in practicing the present invention includes a vacuum pump for creating a vacuum in the process chamber. The apparatus of the invention also includes a process gas inlet assembly such as a pressurized gas cylinder coupled to an inlet conduit connected to a gas distribution faceplate or showerhead in the process chamber. The semiconductor wafer substrate or other workpiece rests on a pedestal or platen, which may apply a bias to the substrate. An RF or other power supply applies electrical power between the gas distribution faceplate or showerhead and the pedestal to excite the process gas or mixture of gasses to form a plasma within the cylindrical reaction region between the faceplate and pedestal.

The ionizable process gas used in the present invention is preferably a mixture of hydrogen and an oxygen-containing or oxidizing gas such as CO or $CO_2$. The oxidizing gas preferably comprises from about 0.5 to 10 volume percent of the mixture. Preferably, the gas mixture to be ionized contains no nitrogen, to avoid causing damage to any underlying CDO dielectric layers by incorporating nitrogen into the film, which is known to create amine groups that can interact with photo resist to cause what is known as the resist poisoning effect. Sensitive resists, such as 193 nm resist, can react with amine groups which neutralize acidic compounds in the resist and prevent them from properly developing and being removed in the solvent removal step of the lithography sequence, thus leaving residual resist in undesired areas of the wafer. With added Ar or He, there may be some benefit, but it has not been characterized with the $H_2+CO_2$ plasma. Using He or Ar in a RIE etch tool could enhance the etch rate or could prove beneficial at the end of the process by sputtering off post etch polymers or other defects that are often left on the 24a or 24b surface. Thus, there may be some benefit with respect to leaving a clean wafer surface 24a or a surface that has fewer submicron defects.

It is important to keep the wafer temperature above about 200° C., preferably above 250° C. and more preferably in the range of about 250-350° C., during the plasma etching. A heating element may be supplied in the process chamber for such purpose. During operation, the plasma process gas moves from one side of the vacuum chamber to the other side due to the vacuum generated on the side of the vacuum chamber opposite the side from which the ionizable process gas flows into the chamber. The plasma process gas diffuses across the surface of the wafer substrate removing the a-carbon (AHM) and carrying the volatilized material towards the vacuum pump assembly.

Figure 2:
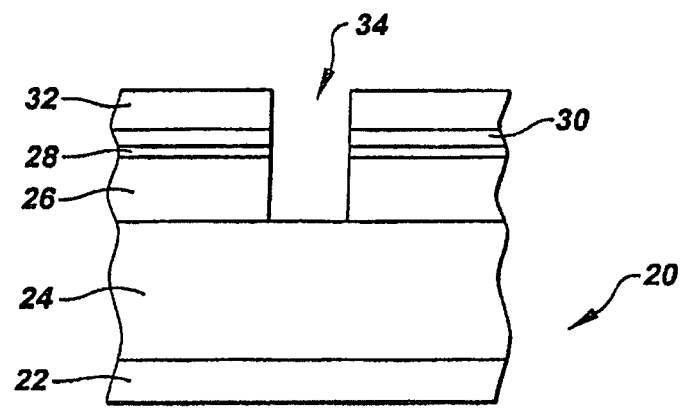
FIG. 2 is a cross-sectional elevational view of the wafer substrate of FIG. 1 after the photoresist, organic hardmask and other layers over the low-k dielectric layer have been etched.

As shown in FIG. 1, a wafer 20 includes etch stop layer 22 over which is deposited a low-k dielectric layer 24. An amorphous carbon hardmask layer 26 is deposited over the low-k dielectric layer 24. A resist layer 32, an optional organic (or spin on) antireflective coating (ARC) layer 30 and a dielectric ARC layer of SiOC (created by reacting $CO_2$ and $Si(CH_3)_4$), SiON or $Si_3N_4$ ARC layer 28 overlie the organic hardmask layer. The resist layer is exposed to a device pattern and developed to remove a volume of resist material corresponding to the pattern. As shown in FIG. 2, the opening 34 in remaining resist layer 32 is then used as a mask to etch a corresponding volume of material from the ARC layers 28, 30 and organic hardmask layer 26.

Figure 3:
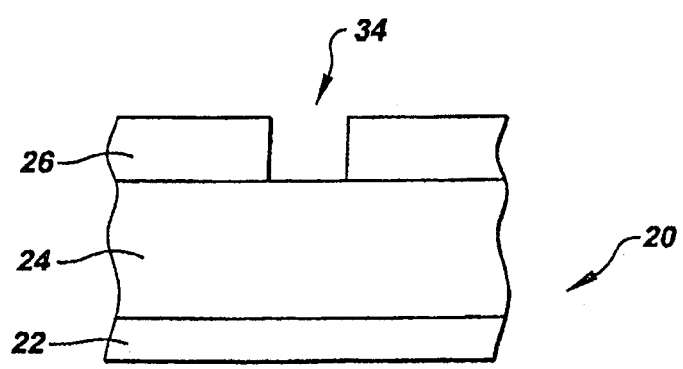
FIG. 3 is a cross-sectional elevational view of the wafer substrate of FIG. 2 after the layers over the etched organic hardmask layer have been removed.
Figure 4:
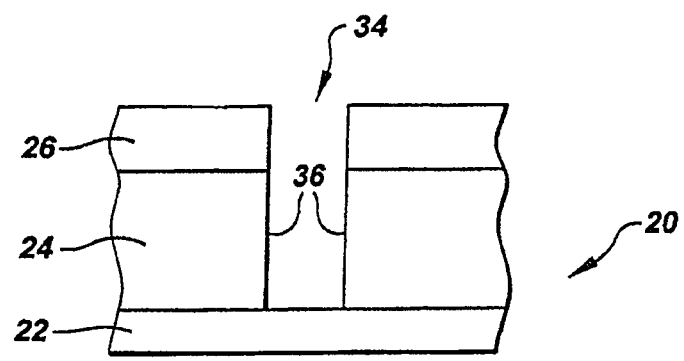
FIG. 4 is a cross-sectional elevational view of the wafer substrate of FIG. 3 after the low-k dielectric layer has been etched through the organic hardmask layer.

The resist and ARC layers are then removed to leave organic hardmask layer and etched pattern opening 34 over layer 24, as shown in FIG. 3. The resist layer and residue may be removed by processes disclosed in U.S. patent application Ser. Nos. 10/890,653, 11/011,273 and 11/128,930, the disclosures of which are hereby incorporated by reference. Typically, the wafer is typically subject to an ashing process to strip and remove the resist layer, for example by transfer to a plasma reactor and hydrogen plasma stripping of the low-k dielectric film. After stripping the resist and other overlying layers, the organic hardmask layer is then used to etch the underlying low-k dielectric layer by, for example, reactive ion etching (RIE), as shown in FIG. 4 where opening 34 is continued down into low-k layer 24 to create an opening having walls 36.

A more common method is for a wafer with the layers shown in FIG. 2 to be exposed to the RIE etch, without removing the layers 32, 30, 28. Due to the long etch time typically required by the RIE etch, the layers 32, 30, 28 will be completely removed before the etch stop layer 22 is exposed. The resulting structure is shown in FIG. 4. This is achieved by exposing the structure shown in FIG. 2 to the RIE etch, thus skipping the need for the separate resist/ARC removal step described above and in FIG. 3, and resulting in the FIG. 4 structure.

Figure 5:
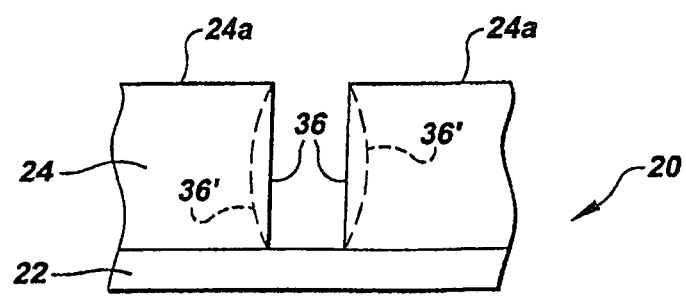
FIG. 5 is a cross-sectional elevational view of the wafer substrate of FIG. 3 after the organic hardmask layer has been removed by the high temperature plasma method of the present invention, without damage to the low-k dielectric layer.

The wafer is then subject to the high temperature plasma cleaning method of the present invention to remove the organic hardmask layer, leaving the low-k dielectric layer undamaged and ready to receive a conductive metal in opening 36. The plasma processing may be conducted in the same reactor used for the hydrogen plasma ashing process, but requires the use of a heating element to achieve the desired reaction temperature. Subsequently, as shown in FIG. 5, the surface 25 of the dielectric layer 24 is substantially free of a-carbon or other organic hardmask residue, and the dimensions of the etched via or trench 36 in the dielectric layer are unaffected and not subject to any damage such as by eroded sidewalls 36'.

In a Novellus Systems Iridia 200 mm etch tool, the wafer comprising the amorphous carbon hardmask layer overlying the low-k dielectric layer is heated by heat lamps to a typical temperature of 280° C. Microwave power in the range of about 1000-3000 W, typically about 1800 W, at 2.45 GHz may be applied to a $H_2/CO_2$ gas mixture flowing at a rate of about 500-4000 sccm, typically about 1800 sccm, into the chamber maintained at a pressure in the range of 750-4000 mT, typically 1000 mT. After a processing time of between about 30 and 180 seconds, typically about 90 seconds, the amorphous carbon hardmask layer is removed without substantial damage to the low-k dielectric layer.

In a Novellus Systems Gamma tool, the wafer comprising the amorphous carbon hardmask layer overlying the low-k dielectric layer is heated by an electrical resistance heated platen to a typical temperature of 280° C. RF power in the range of about 500-3000 W, typically about 2000 W, at 3.56 MHz may be applied to a $H_2/CO_2$ gas mixture flowing at a rate of about 5000-40000 sccm, typically about 20000 sccm, into the chamber maintained at a pressure in the range of 750-4000 mT, typically 1100 mT. The tool contains from 4 to 6 platens, and the wafer is moved through all of the platens during the etch processing. After a total processing or plasma exposure time of between about 20 and 180 seconds, typically about 90 seconds, the amorphous carbon hardmask layer is removed without substantial damage to the low-k dielectric layer.

In a Novellus Systems Iridia 300 mm Sierra etch tool having a dual power source, the wafer comprising the amorphous carbon hardmask layer overlying the low-k dielectric layer is heated to a typical temperature of 280° C. Microwave power in the range of about 1000-3000 W, typically about 1800 W, at 2.45 GHz may be applied to a H2/CO2 gas mixture flowing at a rate of about 500-4000 sccm, typically about 1800 sccm, into the chamber maintained at a pressure in the range of 750-4000 mT, typically 1000 mT. The platen supporting the wafer is inside a RF plasma reaction chamber, and is coupled to the RF source which supplies power in the range of 500-2000 W, typically 1000 W, at 3.56 MHz. After a processing time of between about 30 and 180 seconds, typically about 90 seconds, the amorphous carbon hardmask layer is removed without substantial damage to the low-k dielectric layer.

The gas flow rate, RF power setting, time of exposure and other parameters may be adjusted to achieve desired results for other cleaning tasks.

Thus, the present invention provides an improved method of etching and/or removing organic hardmask layers from wafer substrates in a lithographic process, particularly when removing amorphous carbon from a low-k dielectric layer. The present invention achieves such organic hardmask removal and without damaging the underlying low-k dielectric substrate.

While the present invention has been particularly described, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

The invention claimed is:

1. A method of etching or removing an amorphous carbon organic hardmask comprising:

providing a semiconductor wafer substrate comprising an exposed low-k dielectric and having thereover an amorphous carbon organic hardmask to be removed;

introducing over the substrate and amorphous carbon organic hardmask an ionizable gas comprising a mixture of hydrogen and an oxidizing gas;

applying energy to the mixture to create a plasma of the mixture; and contacting the amorphous carbon organic hardmask with the plasma, wherein the substrate and amorphous carbon organic hardmask are at a temperature in excess of 200° C., to remove at least a portion of the amorphous carbon organic hardmask and exposing the substrate without substantially harming the underlying substrate.

2. The method of claim 1, wherein the organic hardmask comprises chemical vapor deposited amorphous carbon.

3. The method of claim 1, wherein substrate comprises a dielectric film having a dielectric value (k) less than about 4.0.

4. The method of claim 1, wherein the substrate comprises a dielectric film having a dielectric value (k) less than about 3.0.

5. The method of claim 1, wherein the substrate comprises a dielectric film having a dielectric value (k) less than about 2.5.

6. The method of claim 4, wherein the dielectric film comprises carbon-doped oxide dielectric material having a dielectric value (k) less than about 3.0.

7. The method of claim 1, wherein the gas mixture is nitrogen-free.

8. The method of claim 1, wherein the amorphous carbon organic hardmask is completely removed from the underlying substrate.

* * * * *